(12) United States Patent
Bour et al.

(10) Patent No.: US 8,470,619 B2
(45) Date of Patent: Jun. 25, 2013

(54) SELECTIVE DECOMPOSITION OF NITRIDE SEMICONDUCTORS TO ENHANCE LED LIGHT EXTRACTION

(75) Inventors: David P. Bour, Cupertino, CA (US); Clifford F. Knollenberg, Fremont, CA (US); Christopher L. Chua, San Jose, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 457 days.

(21) Appl. No.: 12/909,548

(22) Filed: Oct. 21, 2010

(65) Prior Publication Data
US 2011/0039360 A1 Feb. 17, 2011

Related U.S. Application Data

(62) Division of application No. 12/337,505, filed on Dec. 17, 2008, now Pat. No. 8,124,993.

(51) Int. Cl.
*H01L 21/00* (2006.01)

(52) U.S. Cl.
USPC ............. 438/22; 257/98; 438/25; 438/26; 438/29

(58) Field of Classification Search
USPC ................. 257/98; 438/22, 25, 26, 29
See application file for complete search history.

(56) References Cited

U.S. PATENT DOCUMENTS

| | | | |
|---|---|---|---|
| 6,071,795 A | 6/2000 | Cheung et al. | |
| 6,420,242 B1 | 7/2002 | Cheung et al. | |
| 6,562,648 B1 | 5/2003 | Wong et al. | |
| 6,617,261 B2 | 9/2003 | Wong et al. | |
| 6,781,160 B1 | 8/2004 | Tsai et al. | |
| 7,547,925 B2 | 6/2009 | Wong et al. | |
| 7,749,782 B1 | 7/2010 | Knollenberg et al. | |
| 2002/0014629 A1 | 2/2002 | Shibata et al. | |
| 2004/0206971 A1 | 10/2004 | Erchak et al. | |
| 2008/0054296 A1 | 3/2008 | Yoon et al. | |
| 2008/0113463 A1 | 5/2008 | Liu et al. | |
| 2008/0123711 A1 | 5/2008 | Chua et al. | |
| 2008/0144688 A1 | 6/2008 | Chua et al. | |
| 2009/0039367 A1 | 2/2009 | Iso et al. | |
| 2009/0090932 A1 | 4/2009 | Bour et al. | |

OTHER PUBLICATIONS

Knollenberg et al.: U.S. Appl. No. 12/337,491 entitled "Laser Roughening to Improve LED Emissions" filed Dec. 17, 2008.
T. Fujii, Y. Gao, R. Sharma, E. L. Hu, S. P. DenBaars, and S. Nakamura, "Increase in the extraction efficiency of GaN-based light-emitting diodes via surface roughening." Applied Physics Letters. 84, (6), Feb. 9, 2004, p. 855.
Chih-Chiang Kao, H.C. Kuo, K.F. Yeh, J.T. Chen, W.L. Peng, H.W. Huang, T.C. Lu, and S.C. Wang, "Light-Output Enhancement of Nano-Roughness GaN Laser Lift-Off Light-Emitting Diodes Formed by ICP Dry Etching," IEEE Photonics Technology Letters, 19, (11), Jun. 1, 2007, pp. 849.
M. K. Kelley, O. Ambacher, B. Dahlheimer, G. Groos, R. Dimitrov, H. Angerer, and M. Stutzmann, "Optical patterning of GaN films," Applied Physics Letters, 69 (12), Sep. 16, 1996, p. 1749.

*Primary Examiner* — Anthony Ho
(74) *Attorney, Agent, or Firm* — Bever, Hoffman & Harms, LLP; Patrick T. Bever

(57) ABSTRACT

A method of texturing a surface within or immediately adjacent to a template layer of a LED is described. The method uses a texturing laser directed through a substrate to decompose and pit a semiconductor material at the surface to be textured. By texturing the surface, light trapping within the template layer is reduced. Furthermore, by patterning the arrangement of pits, metal coating each pit can be arranged to spread current through the template layer and thus through the n-doped region of a LED.

20 Claims, 8 Drawing Sheets

SELECTIVE DECOMPOSITION OF NITRIDE SEMICONDUCTORS TO ENHANCE LED LIGHT EXTRACTION

CROSS-REFERENCE TO RELATED APPLICATIONS

This application is a divisional of U.S. patent application Ser. No. 12/337,505 entitled "Selective Decomposition Of Nitride Semiconductors To Enhance LED Light Extraction", filed Dec. 17, 2008 and is related to U.S. patent application Ser. No. 12/337,491, entitled Laser Roughening to Improve LED Emissions, filed on Dec. 17, 2008, and hereby incorporated by reference in its entirety.

BACKGROUND

In nitride UV LED structures, high efficiencies, herein defined as achieving a high light output per unit of energy input is important. One method of improving LED efficiency is by improving the extraction efficiency of light from the LED structure.

In forming a UV LED structure over a typical sapphire substrate, a thin template layer is formed between the substrate and the n-type AlGaN layer of the LED structure. This thin template layer helps match the substrate lattice structure to the n-type AlGaN layer lattice. In some cases the template layer may include a number of dislocations that do not propagate into the n-type AlGaN layer. These dislocations facilitate the relief of strain resulting from the mismatch between the lattices. However, the template layer also has an unintended and undesirable side effect. In particular, the smooth interface between the substrate and the template layer and a parallel second smooth surface between the n-type AlGaN layer and the template layer work together to form a waveguide. Thus the template layer can act as a waveguide that channels light away from the direction of the intended LED output. Channeling light away from the intended LED direction results in lost photons, and a corresponding decrease in LED efficiency.

Thus a structure and/or method is needed to reduce this channeling effect and thereby improve LED light output.

SUMMARY

A method of using a laser to texture a surface inside of a LED is described. The surface is typically located in or adjacent to a template layer of the LED. The textured surface helps prevent light from being trapped and eventually absorbed in the template layer thereby improving LED efficiency.

The laser decomposes the material in the LED, typically AlGaN, to result in metal coated pitted structures. By arranging the pits such that the metal contacts a n-contact of the LED, current can be spread through the textured surface and thereby improve current spreading through the n-doped layer of the LED.

DETAILED DESCRIPTION

In the description, we describe a method of using a laser to texture a template layer interface or an intermediate layer within a template layer. The texturing prevents the template layer from acting as a waveguide thereby improving light extraction efficiency from a LED.

Figure 1:
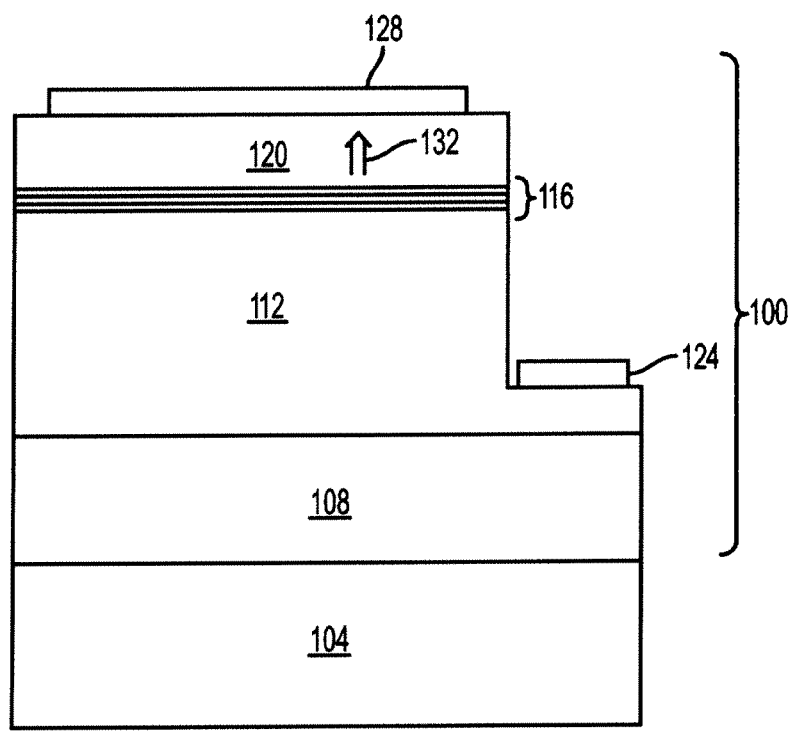
FIG. 1 shows an example LED structure formed over a substrate.

FIG. 1 shows an example LED structure 100 formed over a sapphire substrate 104, however other substrate such as SiC or GaN are possible. In FIG. 1, the LED structure includes an intermediate template layer. Template layer 108 typically includes a nitride compound, usually GaN, AlN, InN, AlGaN, or InGaN, or AlInGaN. The template layer helps match the LED n-doped layer 112 lattice with the lattice of substrate 104, typically a sapphire substrate. The template layer is typically thin, ranging in thickness between 0.1 and 10 micrometers.

Formed over the intermediate template layer 108 are the traditional parts of a light emitting diode (LED) including a n-doped layer 112, a multiple quantum well active layer 116 and a p-doped layer 120. An n-electrode 124 and a p-electrode 128 provide electron and hole currents, respectively, that flow into the active layer 116 to generate spontaneous emission of light. In order to allow light output from the LED along direction 132, the p-electrode is usually formed from a material transparent to the light output by active layer 116. At UV frequencies typical of nitride LEDs, typical transparent p-electrode material include ITO, NiO with embedded gold clusters and doped ZnO. An alternative is to use an opaque electrode arranged in a mesh grid where the electrode coverage is minimized to less than 50% of the LED area. Such an alternative structure is described in U.S. patent application publication No. 20080144688 entitled Light Emitting Devices with an Electrically Active top Reflector Contact filed Dec. 21, 2007 by Chua et al. and hereby incorporated by reference.

Figure 2:
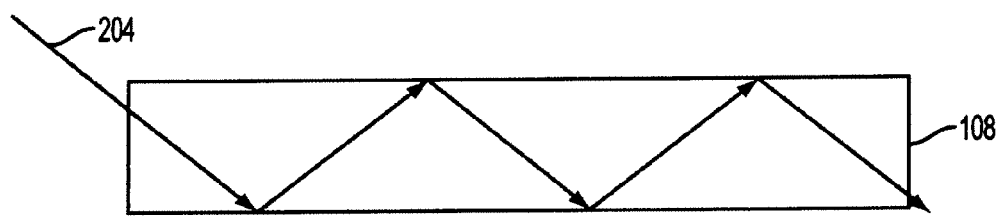
FIG. 2 shows the trapping of light in a template layer.

One problem with the illustrated design of FIG. 1 is that template layer 108 can act as a light "trap" or waveguide. FIG. 2 shows that light 204 from an active region getting trapped in template layer 108. Light "trapped" in template layer 108 is eventually absorbed and thus lost.

Figure 3:
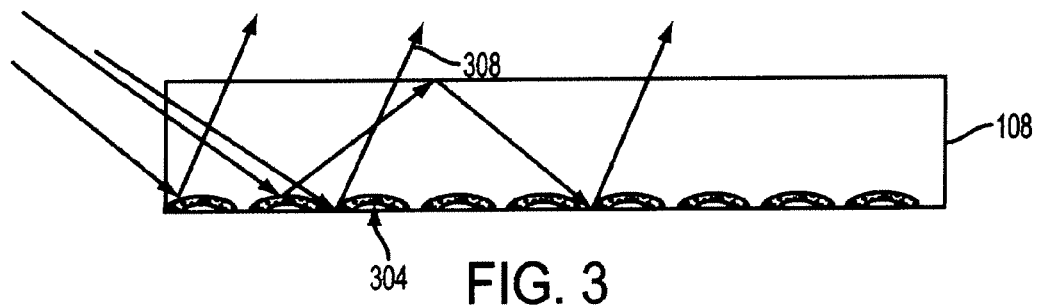
FIG. 3 shows introducing pits into a template layer to prevent the trapping of light in the template layer.

FIG. 3 shows texturing at least one surface in or adjacent to the template layer to avoid trapping of light in the template layer 308. In one embodiment, the textured surface may be at the interface between the template layer and the substrate 304. Alternately, the textured surface may be at the interface between the template layer and the n-doped region. In still a third embodiment, the textured surface may be at an intermediate material in an intermediate material layer within the template layer. Texturing an interface of the template layer or an intermediate material in the template layer disrupts the waveguiding effect and reflects some of the light back through the active layer and through the transparent p-contact.

Figure 4:
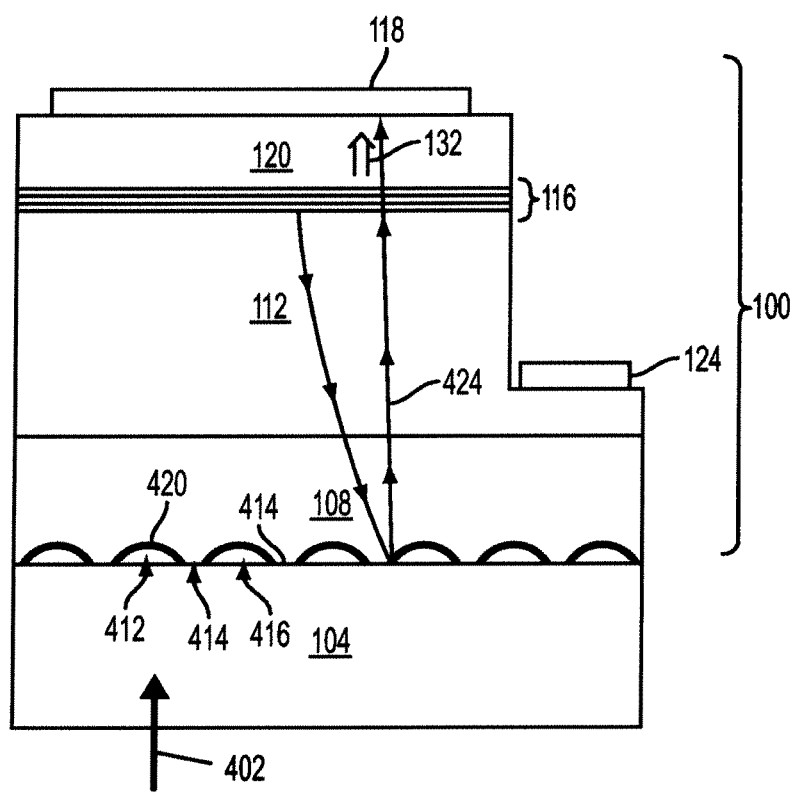
FIG. 4 shows the use of a texturing laser to create pits in a surface to be textured.

In order to texture the surface, a texturing laser is used. FIG. 4 shows the result of directing a texturing laser light 402 through substrate 404 to create a roughened interface. Typically the texturing laser light frequency is selected such that the light is not absorbed in substrate 104. The laser thus passes through the substrate and is absorbed by a surface in or adjacent to the template layer. One example of such a laser is a frequency tripled or frequency quadrupled YAG laser. A frequency quadrupled YAG laser typically has a wavelength of approximately 266 nm. Other possibilities are excimer lasers that output in the 193-308 nm frequency range. The laser is typically pulsed and focused such that the laser spot size area is less than 0.01 mm$^2$. The laser intensity is adjusted such that the power density in the laser spot is between 50 J/cm$^2$ and 0.4 J/cm$^2$.

The intensity of the laser is sufficient to locally heat and decompose the surface to be textured. The small spot size of the laser at the surface to be textured is sufficiently small that pits 412, 416 are created in the surface to be textured. The pits are created because the laser heats the material originally in pits 412, 416 above a decomposition temperature thereby decomposing the compound semiconductor material originally in pits 412, 416, typically into a nitrogen gas and an alloy of group III metals (typically including one or more of aluminum, indium, and gallium). After material decomposition, a pit that has a depth of between 50 nm and 5 microns remains. As used herein the term "pit" shall be broadly defined to include any sort of indentation or cavity that results from the vaporized material. Although laser spots are typically oval in shape, as used herein "pit" is not limited to circular or oval shapes. For example, the "pit" may refer to a line or any other arbitrary shaped cavity created by the texturing laser. Viewed from the top, the "pit" also may be referred to as a "dimple".

As the compound semiconductor decomposes, a metal residue remains. The metal residue 420 coats the walls of each pit 412, 416 or pit perimeter. In the case where material in the layer to be textured includes AlN, AlGaN, AlInN or AlInGaN, aluminum will form a substantial portion of the metal residue 420. Aluminum is an excellent UV reflector. Thus, the aluminum enhances the reflection of incident light from the textured layer thereby improving LED extraction efficiency by directing light along general direction 424, out of the LED structure.

In order to prevent separation of the n-doped layer 112 of the LED structure 100 from the substrate, the pattern of pits in the template layer typically includes unaffected regions 414, herein defined as regions in the textured layer that are unaffected by the texturing laser. Such unaffected regions 414 are typically between adjacent pits. These unaffected regions remain undisturbed and continue to bond the LED structure to substrate 104. Typically the unaffected regions of the textured layer represents at least (25%) of the total area or the textured layer, or whatever is sufficient to prevent separation of the LED structure 100 from substrate 104.

Figure 10:
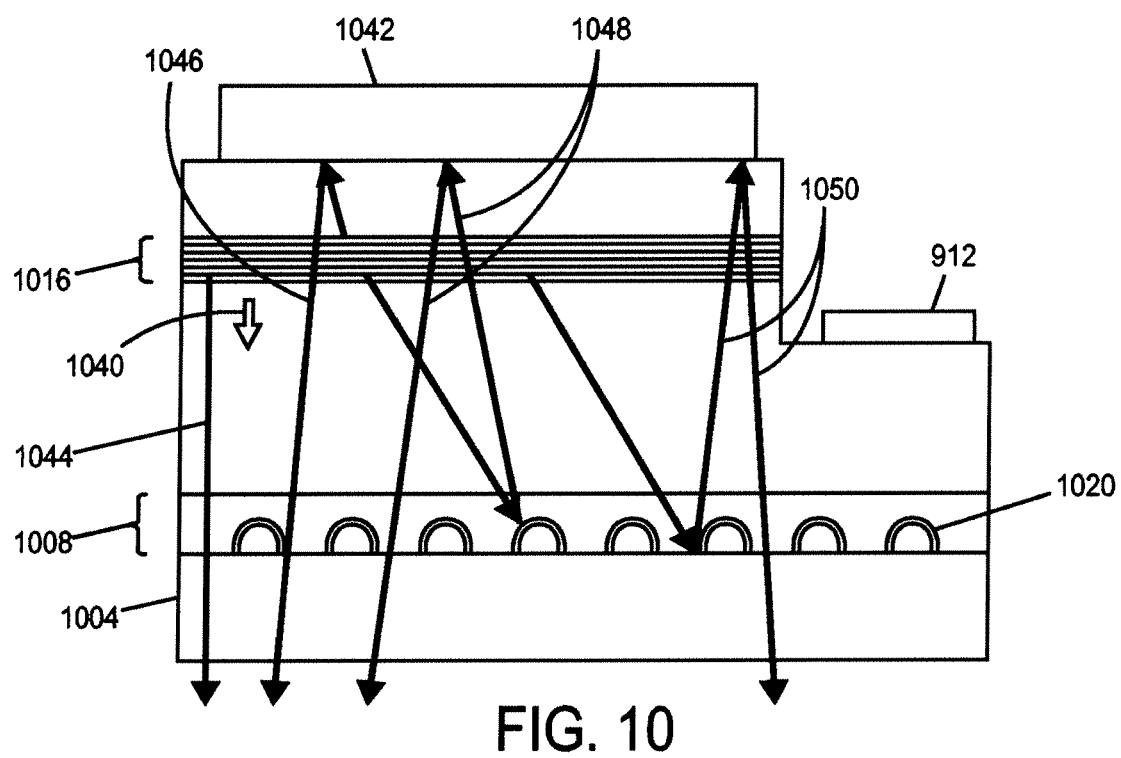
FIG. 10 shows metal coated pits used to enhance light extraction from a LED backside.

FIG. 4 shows extraction of the LED light through the P-contact. FIG. 10 shows an alternative embodiment where the light is extracted from the back side of the LED structure along direction 1040. In order to improve p-contact 1042 reflectivity, the p-contact may be made from a reflective metal such as aluminum, silver, rhodium, or an ohmic metal mesh grid coupled with a reflective multi-layer stack as described in patent application Ser. No. 11/962,861 entitled Light Emitting Devices with an Electrical Active Top Reflector Contact by Chua et al. which is a continuation-in-part of U.S. application Ser. No. 11/516,333, both patent applications are hereby incorporated by reference.

In the illustrated embodiment of FIG. 10, UV light escapes the LED structure at the un-decomposed regions between pits in the textured surface. There are many paths for light originating within the active layer 1016 to escape the LED structure. Examples of possible paths include: (1) being emitted along path 1044 at an angle such that it passes through between adjacent pits without being affected by waveguiding, (2) being emitted along path 1046 where the photons first propagate toward reflective p-contact where they are reflected back at an angle sufficient to avoid waveguiding in template 1008, (3) being emitted along path 1048 where the photons first propagate towards the textured surface, reflect off the reflective metal region of one of the pits 1020, subsequently reflecting off the p-contact at an angle suitable for escape, and (4) being emitted along path 1050 from the active region, waveguided by the unaffected region of the template, subsequently reflected by the metal region of the pits back to the p-contact and then reflected towards an unaffected region at an angle suitable for escape from the LED. While these examples are meant to illustrate the number of possible paths for light escape, other paths not mentioned here are also possible.

As observed, when light is extracted from the substrate side using a reflective p-contact, the regions between pits that are unaffected by the texturing laser permit the light to pass from the template 1008 into the substrate 1004 and subsequently exit the LED. In such embodiment the unaffected regions of the textured surface will preferably exceed 50% of the total surface area with affected regions occupying only the minimum area necessary to prevent wave guiding in the template layer.

Although FIG. 4 shows a uniform series of "pit" structures to texture the interface, the pit pattern should not be so limited. The focused laser that textures the surface may be manipulated to form a variety of pit shapes including lines, dots or various other shapes. Shapes other than ovals formed by a laser spot may be accomplished by moving the texturing laser while it is outputting a beam. Alternately, the texturing laser may be moved and pulsed to form closely spaced and overlapping "oval pits" such that lines or other arbitrarily shaped cavities are formed by a combination of closely spaced overlapping oval shaped pits. Still other shapes may be formed using periodic patterns for which the dimensions are chosen to enhance efficiency through diffraction. For example, diffraction constructive and destructive interference can generate a pattern of bright and dark regions. Aligning corresponding bright and dark regions with transparent or opaque LED features can be used to maximize emission from the transparent features and minimize absorption at opaque features.

Although one use of the textured surface has been to redirect light, other uses are also possible. For example, the arrangement of pits or the pit shapes may be adjusted so that the metal residue 420 that forms over the pits acts as a current spreading layer that spreads current through the n-doped LED layer. Such current spreading layers are particularly useful for UV LEDs that utilize high aluminum content AlGaN for the n-doped layer due to the low electrical conductivity of high aluminum content AlGaN.

Figure 9A:
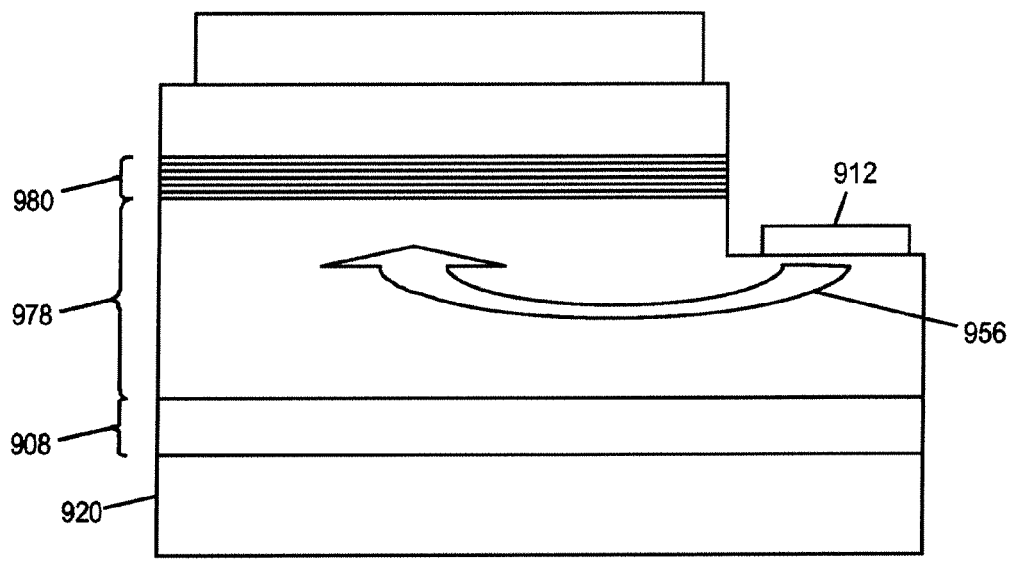
FIG. 9a shows a prior art flow of current though a LED and FIG. 9b shows metal coated pits in the n-doped layer used to enhance current spreading within this structure.

To better understand the problem FIG. 9a shows a prior art LED structure without a low resistance pathway. In this structure current travels a lateral path 956 though n-doped layer 978. The shortest distance between n-contact 912 and active region 980 can be as short as 2 microns, but is more typically 6-10 microns along. Semiconductor resistivity increases with increasing current densities, and increasing distances. To reach the center regions of the LED, the current can have to travel up to 100's of microns through the resistive n-doped layer 978 resulting in uneven current flow through active layer 980 and thus uneven light output in the active layer 980 thereby greatly reducing device efficiency. Providing a low resistance path at the back of the n-doped layer, even with the resistance incurred by passing thru the n-doped layer thickness twice, can significantly reduce the resistive losses and improve device efficiency.

Figure 9B:
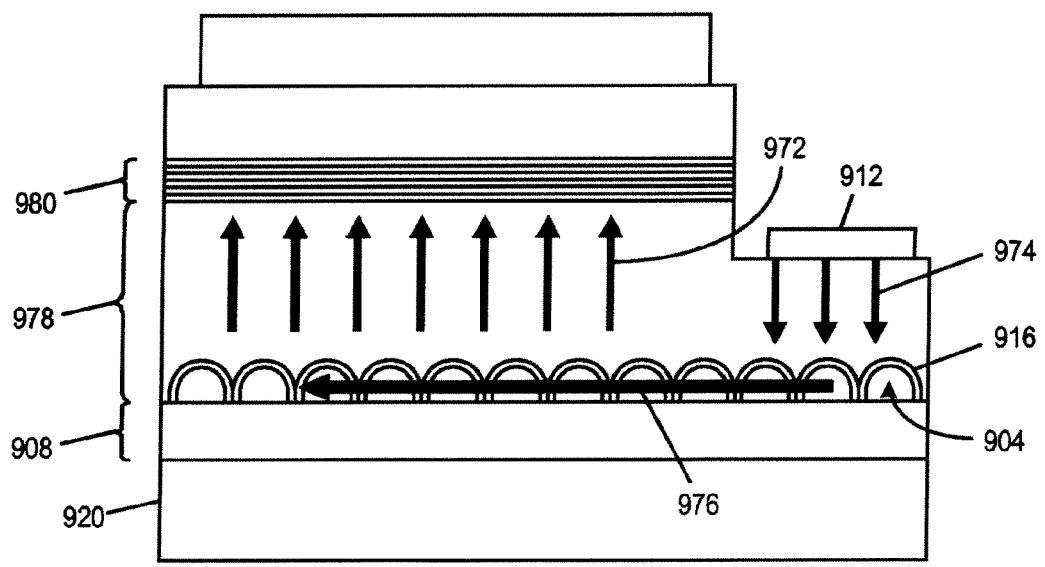

FIG. 9b shows a side cross sectional view of LED providing a low resistance current path 976 using a line of intersecting pits. Each "Pit" 904 is initially formed by a texturing laser transmitting laser light through substrate 920 and the template layer 908 into the n-doped layer 978 where it is absorbed. In the illustrated embodiment, the laser power delivered to the surface to be textured is insufficient to extend the resulting pit completely through the n-doped layer 978 to n contact 912 although alternate embodiments may allow such an extension. Metal 916, typically Aluminum, caused by decomposition of the AlN or AlGaN in n-doped layer 978 coats the pit surface. Close pit spacing results in metal coated pits overlap to form a low resistance electrical path 976.

While the metal 916 does not directly contact re-contact metal 912, the path the electrical current travels though the n-doped material in the direction of 974 to the highly conductive path 976 is very short. The n-doped region thickness is typically between 200 nm and 10 microns. The current thus traverses a similar thickness in direction 972 through the n-doped material to reach the LED active region 980. By providing a conducting layer, the electrical current through the highly resistive n-doped layer of semiconductor is shortened to typically only between 400 nm to 20 microns.

Figure 5:
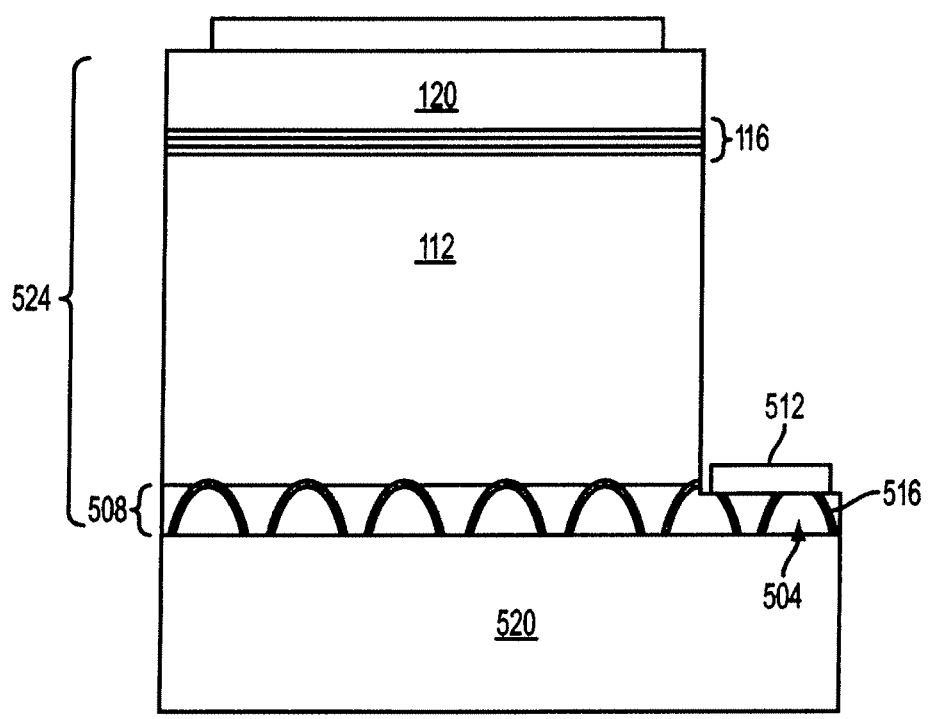
FIG. 5 shows extending metal coated pits completely through the template layer to contact a re-contact of a LED to enable current spreading.

A number of pit arrangements or pit shapes may be used to spread current from the n-contact through the n-doped layer. FIG. 5 shows a side cross sectional view and FIG. 6 shows a top view of one example of a textured surface in a template layer suitable for current spreading. As a variation on the embodiment shown in FIG. 9b, FIG. 5 shows the pits 504 formed in the template layer 508. FIG. 5 also shows the pits going all the way through to contact the n-contact 512. In the illustrated embodiments, the textured surface includes a grid of intersecting lines that carry current from the n-contact thorough the n-doped layer.

FIG. 5 shows a side cross sectional view of the LED structure and the grid of intersecting lines. "Pit" 504 is initially formed by a texturing laser transmitting laser light through substrate 520. The laser power delivered to the surface to be textured is sufficient to extend the resulting pit completely through the template layer 508 to n contact 512. A metal 516, typically Aluminum, coats the surface of the pit. The metal 516 is generated by the decomposition of the AlN or AlGaN template layer 508 into Al metal or an Al/Ga metal alloy. Thus, the metal residue 516 forms a contact with n-contact 512 allowing current to easily flow from the n contact onto metal 516 where it can be spread throughout the template layer 508.

Figure 6A:
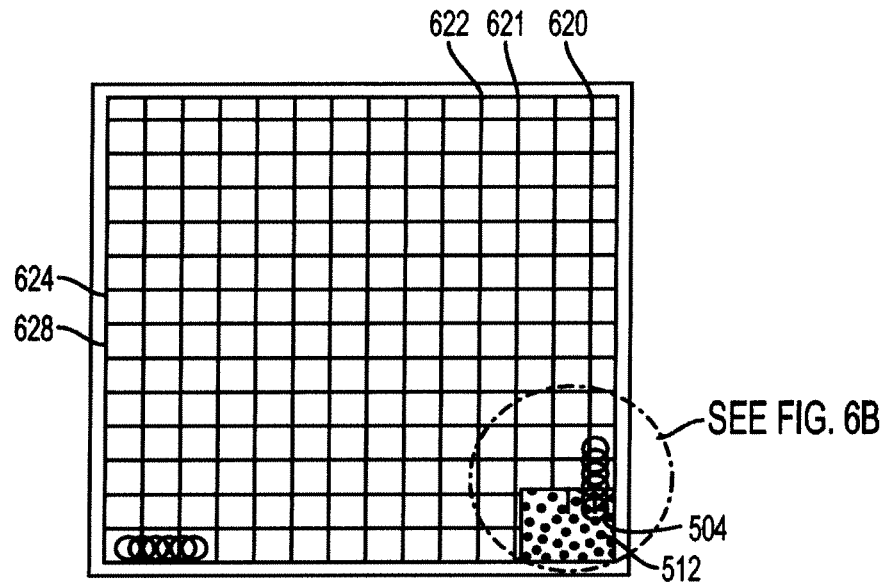
FIGS. 6A and 6B show a matrix of lines in the template layer to spread current from a n-contact through the template layer.
Figure 6B:
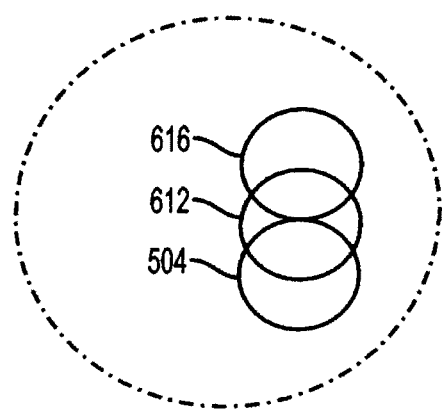

FIG. 6A shows a top view of the template layer 508 including the matrix of aluminum or the Al/Ga alloy grid lines. Pit 504 is a part of gridline line 620 which acts as a wire to carry current from n contact 512. Various methods may be used to form gridline 620. In one example, the laser forming pit 504 is pulsed. Relative motion between the laser and the template layer between pulses causes pits to overlap. FIG. 6B is an expanded view that shows closely spacing the pits 504, 612, 616 that substantially overlap to form a line. The spacing should be sufficiently close that the aluminum residue covering each pit sufficiently contacts the aluminum residue covering an adjacent pit such that electrical current flows easily between the adjacent pits.

FIG. 6A shows forming a matrix of such lines of closely spaced pits. In particular, gridline 620 is part of a matrix of parallel gridlines 621, 622 that intersect at a perpendicular angle with other parallel gridlines 624, 628 to form a matrix of lines that distribute current throughout template layer 508. Electrons flow from the n contact 512, through the matrix of lines and into the n-doped semiconductor layer. From the n-doped semiconductor layer 112, the electrons pass into the LED active region 116 where they recombine with holes from the p-contact generating light.

Although FIGS. 5-6 show a matrix of lines, other patterns that distribute current throughout the template layer, this patent should not be limited as other patterns, may also be used to distribute current. Likewise, although FIGS. 1-6 show the surface to be textured occurring at the template layer and substrate interface, it should be understood that the texturing may also be formed at other surfaces in or adjacent to the template layer.

Figure 7:
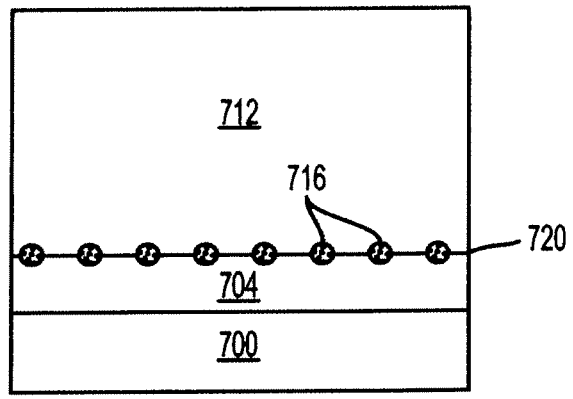
FIG. 7 shows positioning a surface to be textured at the interface of template layer and a n-doped LED layer.

FIG. 7 shows the texturing surface at the interface of the template layer 704 and the n-doped layer 712 of a LED structure heterostructure such that the pitting occurs in the n-doped layer 712. Forming the pits or "features" in the N-doped layer may be accomplished by selecting a frequency of light that is absorbed by the n-doped semiconductor layer but is not absorbed by the template layer (alternately, the template layer material may be selected to be transparent to the texturing laser light). In one embodiment, the template layer is made from a high aluminum content AlGaN which is transparent to the fourth harmonic output of a YAG laser (typically, the aluminum to gallium ratio exceeds 7 to 3). In the example embodiment, the laser light passes through both the sapphire substrate 700 and the AlGaN template layer 704. When the laser light strikes the n-doped semiconductor of the LED heterostructure 712 and is absorbed, pits 716 are formed in the surface 720 to be textured.

Figure 8:
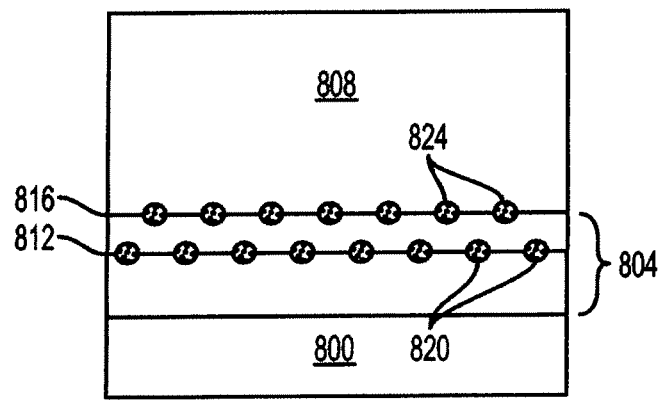
FIG. 8 shows forming two surfaces to be textured in a template layer, a first surface in the approximate center of the template layer and a second surface at the interface of the template layer and a n-doped LED layer.

Template layer interfaces are convenient places to locate a surface to be textured due to the natural material discontinuity. However, a surface to be textured may be located at other places in the template layer. FIG. 8 shows forming a surface 812 to be textured within template layer 804. A material discontinuity formed within the template layer makes the region below surface 812 substantially transparent to the texturing laser. Regions above surface 812 substantially absorb the texturing laser energy. In one embodiment, this is accomplished by varying the aluminum content in an AlGaN template layer 804. Pure GaN begins to absorb light at 362 nm and is transparent to light with a wavelength longer than this, while pure AlN begins to absorb light at 200 nm and is transparent to light with a wave length longer than this. Thus by making the lower portion of the AlGaN template layer 804 aluminum rich, the lower portion below surface 812 may be made transparent to the texturing laser light such that pits 820 or other structures form at surface 812.

FIG. 8 shows that a template layer may also include multiple surfaces to be textured. In FIG. 8, the interface between template layer 804 and LED n-doped layer 808 forms a second surface 816 to be textured. In order to texture multiple layers, the laser wavelength needs to be changed. Thus an AlGaN template layer 804 below surface 812 may have a very high concentration of aluminum, with a somewhat higher concentration of gallium above surface 812 such that a first texturing laser output is absorbed only at surface 816 and a second texturing laser output Is absorbed only at layer 812. Using such an arrangement, the "spacing" between adjacent pits in a surface (used to keep the layers from completely separating) can be "filled" by pits in a different surface. In the illustrated embodiment, the unaffected region in a surface ("spaces") between at least some pits prevents separation of substrate 800 from the LED n-doped layer 808; while the adjacent surfaces 812, 816 minimize the smooth areas in the template layer that can trap light. Current spreading can also be improved by "filling" in such "spaces" using multiple textured surfaces to fill spacing between adjacent pits.

While the above embodiments describe LEDs operating in the UV region of the electromagnetic spectrum, they may also be used at longer wavelengths as permitted by the nitride semiconductor material system. Such longer wavelengths may include parts of the visible spectrum including violet, blue, and green light. LEDs at these wavelength typically employ Ga and In rich alloys of AlGaN, InGaN, AlInN, and AlInGaN, and may include InN and GaN as well. In these alloys, the reflective and conductive Al metal and Al/Ga alloys may be replaced with In or Ga metal and Ga/In or Al/In alloys. Also, in longer wavelength LEDs, SiC or GaN substrates may substitute for the sapphire substrate described.

Although substantial other details have been provided in the above description, it should be understood that such details are provided to facilitate understanding of the invention. The above details should not be used to unduly limit the invention as other embodiments are also contemplated and possible. Instead, the invention should only be limited by the claims as originally presented below, and as they may be amended, to encompass variations, alternatives, modifications, improvements, equivalents, and substantial equivalents of the embodiments and teachings disclosed herein, including those that are presently unforeseen or unappreciated, and that, for example, may arise from applicants/patentees and others.

The invention claimed is:

1. A method comprising:
   forming a LED structure including an active region disposed over a substrate,
   producing a plurality of pits in a surface of the LED structure using a focused texturing laser with a spot size less than 0.01 mm$^2$, the surface being disposed between the substrate and the active region.

2. The method of claim 1, wherein producing the plurality of pits comprises pulsing the texturing laser while gradually moving the texturing laser across the surface such that the plurality of pits approximately overlap.

3. The method of claim 2,
   wherein forming the LED structure further comprises disposing an AlGaN template layer between the substrate and the active layer, forming a n-doped layer coupled to the template layer, and forming a n-electrode coupled to the n-doped layer, and
   wherein producing the plurality of pits further comprises decomposing a portion of the template layer such that each of the plurality of pits is coated with a metal layer that includes at least one of aluminum, gallium, and indium, such that at least one pit is positioned adjacent to the n-contact of the LED structure, and such that the metal layer coating the at least one pit is in contact with the n-contact of the LED structure.

4. The method of claim 2,
   wherein forming the LED structure further comprises forming an AlGaN template layer between the substrate and the active layer, forming a n-doped layer coupled to the template layer, and forming a n-electrode coupled to the n-doped layer, and
   wherein producing the plurality of pits further comprises decomposing a portion of the template layer such that each of the plurality of pits is coated with a metal layer that includes at least one of aluminum, gallium, and indium, such that at least one pit is positioned such that a total distance between the metal layer disposed on said at least one pit and the active region is between 0.2 and 10 microns and a distance between the metal layer disposed on said at least one pit and the n-contact is between 0.2 and 10 microns.

5. The method of claim 3, wherein producing the plurality of pits further comprises controlling the focused texturing laser to form the pits such that the metal layer forms a conductive path between the n-contact and the active region of the LED structure.

6. The method of claim 1,
   wherein forming the LED structure further comprises forming a template layer disposed between the substrate and the active layer, and
   wherein producing the plurality of pits further comprises controlling the focused texturing laser to form the surface being textured at an interface of the substrate and the template layer.

7. The method of claim 1,
   wherein forming the LED structure further comprises disposing a template layer between the substrate and the active layer, and
   wherein producing the plurality of pits further comprises controlling the focused texturing laser to form the surface being textured within the template layer.

8. The method of claim 1,
   wherein forming the LED structure further comprises a forming template layer between the substrate and the active layer, and forming an n-doped region coupled to the template layer, and
   wherein producing the plurality of pits further comprises controlling the focused texturing laser to form the surface being textured at an interface of the template layer and the n-doped region.

9. The method of claim 1, further including texturing a second surface of the LED between the substrate and the active region.

10. The method of claim 9, wherein texturing the second surface comprises using a focused second texturing laser with a spot size less than 0.01 mm$^2$ micrometers to produce a series of pits in the second surface to be textured, the second texturing laser outputting light having different wavelength than the focused texturing laser utilized to produce said plurality of pits such that energy from the focused second texturing laser is absorbed primarily at the second surface and light from the focused texturing laser is absorbed at the first surface to be textured.

11. The method of claim 10, wherein producing said plurality of pits comprises using a frequency quadrupled YAG laser to achieve a wavelength near 266 nm.

12. The method of claim 1,
   wherein forming the LED structure comprises forming a first region having a first concentration of aluminum and a second region disposed over the first region and having a second concentration of aluminum that is higher than the first concentration, and
   wherein producing said plurality of pits comprises utilizing a texturing laser characterized in that the first region is approximately transparent to the texturing laser, whereby the surface is formed at an interface between the first and second regions.

13. The method of claim 1, wherein forming the LED structure comprises forming a template layer on a substrate including at least one of sapphire, gallium nitride, or silicon carbide.

14. The method of claim 1, wherein producing said plurality of pits comprises forming each pit to a depth approximately between 100 nm and 2000 nm.

15. The method of claim 1, wherein producing said plurality of pits comprises utilizing a texturing laser having a power per unit area greater than 0.4 J/cm$^2$.

16. The method of claim 1, wherein forming the LED structure comprises:
   forming a template layer on the substrate;
   forming a n-doped layer on the template layer;
   forming an active layer on the n-doped layer;
   forming a p-doped layer on the active layer; and
   forming a transparent p-contact on the p-doped layer.

17. The method of claim 1, wherein forming the LED structure comprises forming a reflective p-contact on the LED structure such that the reflective p-contact has a reflectivity that exceeds 50%.

18. A method of improving light extraction efficiency of an LED, the method comprising:
   forming a n-doped layer over a substrate,
   forming an active region on the n-doped layer; and,
   using a focused texturing laser delivering a power per unit area in excess of 0.4 J/cm$^2$ to pit a surface between the substrate and the active layer of the LED.

19. The method of claim 18, further comprising forming an AlGaN template layer between the substrate and the n-doped layer,
   wherein using the focused texturing laser comprises producing a plurality of pits in the AlGaN template layer.

20. A method comprising:
   forming a LED structure including:
      a substrate comprising at least one of sapphire, gallium nitride, or silicon carbide,
      a template layer formed on the substrate, the template layer comprising AlGaN having a first aluminum concentration;
      a n-doped layer formed on the template layer, the template layer comprising AlGaN having a first aluminum concentration that is higher than the first aluminum concentration;
      a multiple quantum well active layer formed on the n-doped layer, and
      a p-doped layer formed on the active layer; and
   decomposing a portion of the template layer using a focused texturing laser such that a plurality of pits having a depth between 50 nm and 5 microns are formed, and such that a metal layer is formed on walls of each of the plurality of pits and on a perimeter of each of the plurality of pits.

* * * * *